Figure 1:
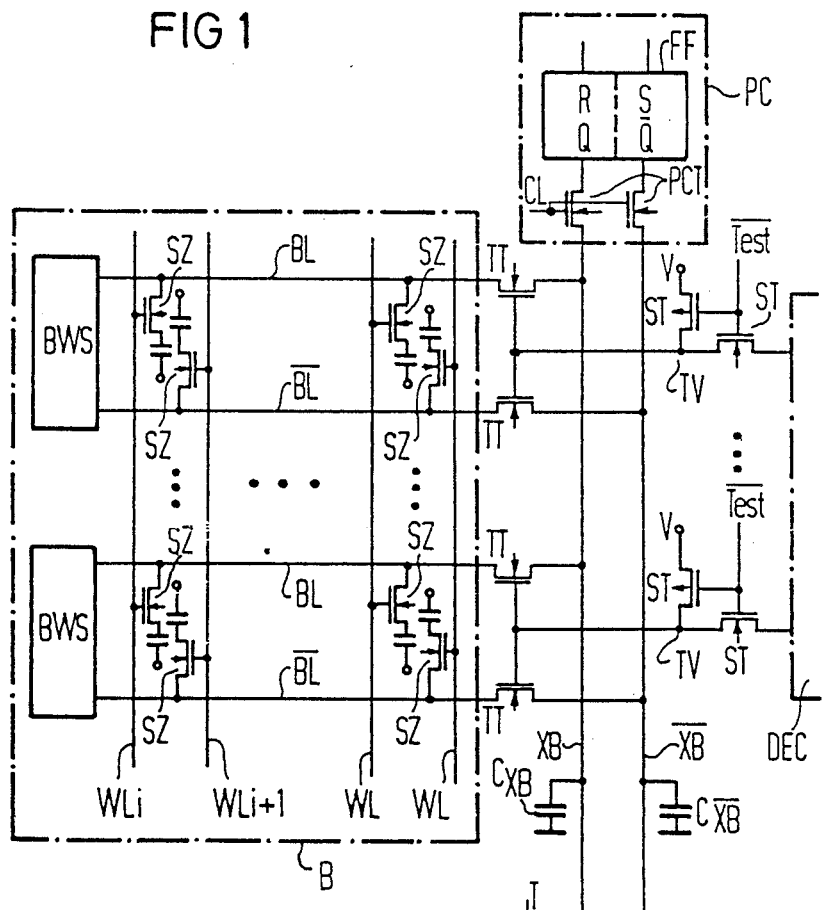

United States Patent [19]

Hoffmann et al.

[11] Patent Number: 4,956,819
[45] Date of Patent: Sep. 11, 1990

[54] CIRCUIT CONFIGURATION AND A METHOD OF TESTING STORAGE CELLS

[75] Inventors: Kurt Hoffmann, Taufkirchen; Hans-Dieter Oberle, Puchheim; Rainer Kraus, Munich; Oskar Kowarik, Grafing, all of Fed. Rep. of Germany

[73] Assignee: Siemens Aktiengesellschaft, Munich, Fed. Rep. of Germany

[21] Appl. No.: 168,653

[22] Filed: Mar. 16, 1988

[30] Foreign Application Priority Data

Mar. 16, 1987 [DE] Fed. Rep. of Germany ....... 3708534

[51] Int. Cl.$^5$ ............................................. G11C 29/00
[52] U.S. Cl. .................................. 365/201; 365/203; 365/190; 371/21.1
[58] Field of Search ...................... 365/201, 203, 190; 371/21

[56] References Cited

U.S. PATENT DOCUMENTS

| | | | |
|---|---|---|---|
| 4,055,754 | 10/1977 | Chesley | 365/201 |
| 4,603,405 | 7/1986 | Michael | 365/201 |
| 4,742,489 | 5/1988 | Hoffmann | 365/201 |
| 4,742,490 | 5/1988 | Hoffmann | 365/201 |
| 4,752,929 | 6/1988 | Kantz et al. | 365/201 |

FOREIGN PATENT DOCUMENTS

| | | |
|---|---|---|
| 0143624 | 6/1985 | European Pat. Off. . |
| 0186040 | 7/1986 | European Pat. Off. . |
| 3530591 | 3/1986 | Fed. Rep. of Germany . |
| 57-100690 | 6/1982 | Japan . |

Primary Examiner—Glenn A. Gossage
Attorney, Agent, or Firm—Herbert L. Lerner; Laurence A. Greenberg

[57] ABSTRACT

A circuit configuration and method for testing storage cells of an integrated semiconductor memory precharges a pair of external bit lines to mutually complementary logic levels. All of the storage cells of a word line are always read-out in parallel. In a "no fault" situation the pair of external bit lines retains its precharge level, whereas in the case of a fault, the level of the external bit line which is precharged to logical 1 falls. This is recognized by a discriminator circuit and analyzed.

9 Claims, 1 Drawing Sheet

CIRCUIT CONFIGURATION AND A METHOD OF TESTING STORAGE CELLS

The invention relates to a circuit configuration and a method for testing storage cells of an integrated semiconductor memory, including a block in which the storage cells are disposed in the form of a matrix, word lines and internal bit lines for driving the storage cells, evaluator circuits each being assigned to a respective internal bit line and dividing the internal bit line into first and second substantially identical bit line halves, a pair of first and second external bit lines, transfer transistors connecting the first external bit line to each of the first internal bit line halves and connecting the second external bit line to each of the second internal bit line halves, and a bit line decoder assigned to the respective internal bit lines and connected to gates of the transfer transistors.

The increase in the number of storage cells in a semiconductor memory in recent years has led to an enormous rise in the test time required to test a semiconductor memory. Whereas, for example, a DRAM with a storage capacity of 4 kB previously could be adequately tested in a test time of 3 to 2 s (depending upon the time and number of test patterns used and other test conditions), the test time of a modern 1MB-DRAM is now on the order of 20 minutes.

Various measures for reducing the test time are already known. For example, European Application No. 0 186 040, corresponding to U.S. Pat. No. 4,742,490, proposes that a semiconductor memory be internally divided into a plurality of blocks and that these be tested in parallel with one another. In practice this permits the test time to be reduced to approximately $\frac{1}{4}$ to $\frac{1}{8}$.

U.S. Pat. No. 4,055,754 proposes that all of the storage cells of one complete word line be tested in parallel with one another with respect to time and that a specified analysis circuit within the semiconductor memory be used for this purpose. Despite a great saving in test time, this structure is disadvantageous because an analysis circuit is required which is formed of at least three logic gates, wherein two of these gates require a number of inputs which is equal to the number of word lines. Such a structure leads to a very large additional surface area requirement, which counteracts the general tendency towards the miniaturization of circuits.

It is accordingly an object of the invention to provide a circuit configuration and a method for testing storage cells, which overcomes the herein aforementioned disadvantages of the heretofore known methods and devices of this general type and which permits the testing of storage cells with a very short time outlay and with a minimal additional surface area requirement. In this case it is accepted that not all conceivable test patterns can be tested. It is equally accepted that not all possible faults and types of faults can be recognized. This is reserved for a detailed checking which can be performed at the end of a production sequence. By way of contrast, test procedures of short duration as employed by the invention are provided as production-accompanying tests (to permit the earliest possible recognition of gross failures and thus to reduce costs), or as short "incoming inspection" tests.

With the foregoing and other objects in view there is provided, in accordance with the invention, a circuit configuration for testing storage cells of an integrated semiconductor memory; the integrated semiconductor memory including a block in which the storage cells are disposed in the form of a matrix, word lines and internal bit lines for driving the storage cells, evaluator circuits each being assigned to a respective internal bit line and dividing the internal bit line into first and second substantially identical bit line halves, a pair of first and second external bit lines, transfer transistors connecting the first external bit line to each of the first internal bit line halves and connecting the second external bit line to each of the second internal bit line halves, and a bit line decoder assigned to the respective internal bit lines and connected to gates of the transfer transistors; the circuit configuration comprising a precharge device connected to the pair of external bit lines for precharging the pair of external bit lines to two mutually-complementary logic levels in test operation, a discriminator circuit being connected to the pair of external bit lines and having an output emitting a fault signal indicating the occurrence of faults in test operation, and the gates of all of the transfer transistors carrying a control potential for the read out of data from the storage cells of the block in test operation.

In accordance with another feature of the invention, the control potential is equal to a supply potential of the overall circuit configuration.

In accordance with a further feature of the invention, the control potential is equal to at least half the difference between a supply potential and a reference potential of the overall circuit configuration.

In accordance with an added feature of the invention, the precharge device includes an RS flip-flop circuit with two mutually-complementary outputs, and precharge transistors connecting the outputs of the RS flip-flop circuit to the pair of external bit lines.

In accordance with an additional feature of the invention, the discriminator circuit is a CMOS-inverter circuit having an input, and including means for switching the input of the discriminator circuit between the two external bit lines.

In accordance with yet another feature of the invention, the CMOS-inverter circuit has a p-channel transistor and an n-channel transistor with equal channel lengths, the p-channel transistor having ten to twenty times the channel width of the n-channel transistor.

In accordance with yet a further feature of the invention, there are provided means for electrically decoupling the discriminator circuit from the pair of external bit lines.

With the other objects of the invention in view, there is also provided a method of testing storage cells of a semiconductor memory; the semiconductor memory including a block in which the storage cells are disposed in the form of a matrix, word lines and internal bit lines for driving the storage cells, evaluator circuits forming each of the internal bit lines into first and second substantially identical bit line halves, pair of first and second external bit lines, transfer transistors connecting the first external bit line to each of the first internal bit line halves and connecting the second external bit line to each of the second internal bit line halves; the method comprises simultaneously testing more than one and as many as all of the storage cells connected to a word line with a discriminator circuit connected to the two external bit lines, and activating a fault signal at an output of the discriminator circuit upon the occurrence of a fault.

In accordance with another mode of the invention, there is provided a method which comprises charging two external bit lines to mutually-complementary logic levels, especially to a supply potential and a reference potential of a circuit configuration, in test operation prior to the read out of data from storage cells.

In accordance with a concomitant mode of the invention, there is provided a method which comprises precharging the external bit lines to different levels, and setting the fault signal when the external bit line precharged to the higher level, preferably a supply potential, falls in level at least to a value which corresponds to the magnitude of a control potential minus a threshold voltage of the transfer transistors.

Other features which are considered as characteristic for the invention are set forth in the appended claims.

Although the invention is illustrated and described herein as embodied in a circuit configuration and a method for testing storage cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
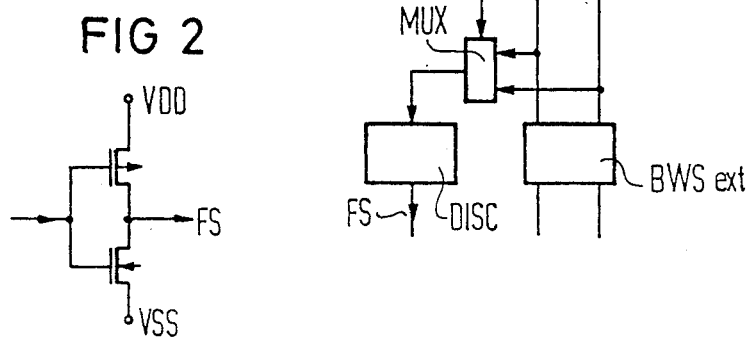

FIG. 1 is a block and schematic circuit diagram of the configuration according to the invention as a whole; and FIG. 2 is a schematic circuit diagram of a possible structure of a discriminator circuit.

Referring now to the figures of the drawings in detail and first, particularly, to FIG. 1 thereof, there is seen a block B including storage cells SZ. The associated semiconductor memory can include one or more block B. This constitutes prior art and has not been shown for clarity of the disclosure. The storage cells SZ are disposed in the form of a matrix and can be addressed through word lines WLi, WLi+1, generally referred to by reference symbol WL, and through internal bit lines. As is generally known, each internal bit line is assigned an evaluator circuit BWS.

The evaluator circuit BWS forms the internal bit line into two approximately identical bit line halves BL, $\overline{BL}$. Generally, for reasons of symmetry, the two halves are exactly identical with respect to the functioning of the evaluator circuit BWS, to the extent that is technologically possible. With regard to the configuration of bit lines and evaluator circuits BWS, those skilled in the art will be familiar with two different concepts. In the case of the earlier so-called open bit-line concept, the two bit line halves are disposed on both sides of evaluator circuits BWS. Thus the evaluator circuits BWS divide the storage cell array of a block B into a left-hand and a right-hand cell array half. In the case of the more modern bit line concept, referred to as the folded bit line concept, the two bit line halves are disposed on one single side of the evaluator circuit BWS. Thus with this concept the evaluator circuits BWS are located at the edge of the cell array. The present invention can be implemented in the case of both bit line concepts.

The evaluator circuits and the storage cells also constitute prior art. Evaluator circuits known to those skilled in the art are formed of two transistors which are cross-coupled at the gates thereof, with a common terminal connected to a potential which car generally be switched or is controllable as a function of time. The free ends of the transistors of the evaluator circuits are each connected to a bit line half BL,$\overline{BL}$. Other constructions in accordance with the prior art are also conceivable.

The storage cells also correspond to the prior art. When a DRAM is used as the semiconductor memory, they are generally formed of one transistor storage cells. The present invention can also be applied to static memories (SRAMs) and to programmable memories such as EPROMs and EEPROMs, without fundamental modifications. In the illustrated embodiment, one transistor one capacitor storage cells of a DRAM have been shown. It is irrelevant to the application of the invention, whether the memory concept is such that so-called dummy cells are to be provided or whether the evaluator circuit operates in accordance with the so-called mid-level concept.

The circuit configuration according to the invention also includes a pair of external bit lines XB,$\overline{XB}$ for each block B. One of the ends (although any other arbitrary position is also conceivable) of each of the external bit lines is connected to a precharge device PC. The precharge device PC serves to precharge the external bit lines XB,$\overline{XB}$ to two mutually-complementary logic levels, in particular to the supply potential VCC and the reference potential VSS of the semiconductor memory, as will be described later below. The pair of external bit lines XB,$\overline{XB}$ is also connected to an external evaluator circuit BWSext in the usual way, and is additionally connected to a discriminator circuit DISC. The output of the discriminator circuit DISC serves to display the occurrence of a fault during test operation by means of a fault signal FS.

Each first bit line half BL of an internal bit line is connected through a separating or transfer transistor TT to the first (XB) of the external bit lines. Accordingly, every second bit line half $\overline{BL}$ of an external bit line is also connected through a separating transistor TT to the second ($\overline{XB}$) of the external bit lines. Thus the two transfer transistors TT of a bit line form a pair of transfer transistors. The gate of each transfer transistor TT is advantageously connected through the n-channel transistor of a CMOS-switching transistor pair ST to a bit line decoder (given reference symbol "DEC") corresponding to the respective internal bit line. Furthermore, in accordance with the invention, the gate of each transfer transistor TT is connected to a potential V through the p-channel transistor of the CMOS-switching transistor pair ST. The potential V can be formed, for example, by the supply potential VCC of the overall semiconductor memory. However, according to another embodiment of the invention it can also have a value which amounts to at least half the difference between the supply potential VCC and the reference potential VSS of the overall circuit configuration. The gates of the CMOS-switching transistor pair ST are connected to a signal $\overline{Test}$. In test operation, under the control of a signal $\overline{Test}$, the potential Vref is connected by the p-channel transistor to the gates of the transistor pairs TT, as a control potential TV. It thus replaces the decoder output signals which occur in normal operation. Thus, whereas in normal operation the internal bit lines BL,$\overline{BL}$ are driven individually in the usual way through bit line decoders (schematically indicated as "DEC" in FIG. 1), in test operation in accordance with the present invention, all of the internal bit lines BL,$\overline{BL}$ are driven in parallel relative to one another, which can place through the CMOS-switching transistor pairs ST.

Embodiments are also conceivable in which these actuations are contained in the decoders DEC so that for example, all of the decoders are activated simultaneously. In this context express reference is made to U.S. Pat. No. 4,906,994 and to U.S. Pat. No. 4,855,621, both having the same filing date as the instant application.

The discriminator circuit DISC is advantageously a simple, universally-known CMOS-inverter circuit, as shown in FIG. 2. The input of the discriminator circuit DISC is connected, for example, through a multiplexer MUX to the two external bit lines XB,$\overline{XB}$. A control signal T causes a switch-through of the input of the multiplexer MUX to the discriminator circuit DISC which is connected to the external bit line XB or $\overline{XB}$ which was previously precharged to logical 1. It is particularly advantageous to construct the p-channel transistor in such manner that the channel width thereof is 10 to 20 times that of the n-channel transistor, assuming equal channel lengths. In this way the discriminator circuit DISC is particularly sensitive in the potential range assumed by one of the two external bit lines XB,$\overline{XB}$ in the case of a fault.

According to one embodiment of the invention, the precharge device PC includes an RS flip-flop circuit FF with two conventional, mutually-complementary outputs Q,$\overline{Q}$. Each output Q,$\overline{Q}$ is connected through a precharge transistor PCT to one of the pair of external bit lines XB,$\overline{XB}$. The gates of the precharge transistors PCT are connected to a clock signal CL. In test operation the clock signal CL controls the precharging of the external bit lines XB,$\overline{XB}$ performed by the precharge device PC.

While making reference to the above-described advantageous circuit configuration, the mode of operation thereof and the method in accordance with the invention will now be described:

In test operation, all of the storage cells SZ which are connected to a particular word line WL are charged to a logic level which is identical for all of the storage cells SZ connected to the word line WL. The logic level is representative of an item of information which is to be input into the storage cells SZ. The logic level can differ (logical 0 or logical 1) for the individual word lines. It is only important that within a word line the same information is input into all of the storage cells.

Thus the selection of possible test patterns which are to be used is restricted to test patterns for which all of the storage cells of a word line contain the same information. Such test patterns are formed, for example, of "all 0s", "all 1s", "alternating rows", left-hand half of the storage cell array "all 0s", and right-hand half "all 1s", or vice-versa. For example, a "checkerboard" test pattern is not possible, in which the information stored in the storage cells of a word line alternates from storage cell to storage cell ('1010'), as is known. However, if the storage cells of individual bit lines are excluded from the test by suitable measures in the bit line decoders, more complicated test patterns, such as for example, the above-mentioned checkerboard test pattern, are also possible. However, for simple function tests such as an incoming inspection or coarse testing as to whether the memory is actually functioning, this is entirely adequate. If the storage cells of each word line are tested both with respect to "information equal to logical 0" and with respect to "information equal to logical 1", the following faults can always be discovered by the method according to the invention:

(a) bit line is "clamped" to an (arbitrary) potential;
(b) (at least) one storage cell is "clamped" to an (arbitrary) potential.

The two following types of faults can be determined in most cases:

(c) (at least) one word line decoder is operating in faulty fashion;
(d) (at least) one word line is "clamped" at an (arbitrary) potential.

The necessary test time is not determined in the usual manner, for example by the number of storage cells SZ (which are to be tested), but instead by the number of word lines WL.

The external bit line pair, XB,$\overline{XB}$ is charged to two mutually-complementary logic levels (logical 0, logical 1), either simultaneously with the input into the storage cells SZ or thereafter, but before the read-out on the storage cells SZ of a word line WL. These logic levels are identical with respect to their significance or importance to the logic levels which can be input as information into the storage cells. The assignment of the logic levels to the two lines of the external bit line pair XB,$\overline{XB}$ is selected or contrived in such a way that, in general terms, the external bit line XB or $\overline{XB}$ which is connected through a separating transistor TT to an internal bit line half BL or $\overline{BL}$ whose associated storage cells are to be tested, has a logic level identical to the logic level which these storage cells SZ possess as information in the form of stored charges.

This has the following meaning in the concrete example to which the circuit configuration shown in FIG. 1 relates: It will be assumed that (in the next test cycle) all of the storage cells SZ which are connected to the word line WLi are to be tested. A logical 1 is to be stored in the storage cells SZ, as information in the form of electric charges. The storage cells SZ are all connected to the first bit line halves BL of the bit lines to which they are assigned. Each of these first bit line halves BL of the internal bit lines is connected through a first transfer transistor TT to the first external bit line XB. Since the storage cells SZ which are to be tested are assumed to have stored a logical 1, the first external bit line XB must also be precharged to logical 1. Accordingly, the other external bit line $\overline{XB}$ is to be precharged, in complementary fashion, to logical 0. If the storage cells SZ which are to be tested are assumed to have stored a logical 0 in contrast to the foregoing, then the first external bit line XB must be precharged to logical 0, and the other external bit line $\overline{XB}$ must be precharged to logical 1. Those skilled in the art will be easily able to implement the situations in which the storage cells SZ which are to be tested are connected to the second internal bit line half $\overline{BL}$, on the basis of the foregoing.

The precharging itself is carried out by the precharge device PC. In the event that the precharge device PC includes an RS flip-flop FF, it is set, for example, in such a way that a logical 1 occurs at its output Q which is assigned to the first external bit line XB, and a logical 0 occurs occurs at its output $\overline{Q}$ which is assigned to the other external bit line $\overline{XB}$. In this embodiment the precharging procedure itself is carried out by means of the precharge transistors PCT. For this purpose, as already mentioned above, the precharge transistors PCT are switched into conductivity and are then blocked during or following the input of the information into the storage cells SZ, under the control of a clock signal CL. The charges in the external bit lines XB,$\overline{XB}$ then remain stored in parasitic capacitances $C_{XB}C_{\overline{XB}}$ thereof.

Then, under the control of word line decoders which are not shown in FIG. 1 and which can constitute prior art, one word line, in the present example the word line WLi, is activated. Thus in the case of all of the storage cells SZ connected to this word line WLi, the stored information is transferred to the bit line half assigned to the respective storage cell, which is the first bit line half BL in the example. The electric states of each bit line are then evaluated and amplified by the evaluator circuit BWS assigned thereto, in a conventional manner. As a result, the logic states 0 and 1 occur with levels which can be clearly distinguished from one another electrically on both bit line halves BL,$\overline{BL}$ of each bit line.

In the present example it has been assumed that a logical 1 is to be read out from the storage cells SZ. If all of the read-out storage cells SZ are in order, a logical 1 occurs on every first bit line half BL and a logical 0 occurs on every second bit line half $\overline{BL}$. The gates of all of the transfer transistors TT carry the control potential TV. As a result, all of the transfer transistors TT which are connected to the first halves of the internal bit lines BL, block (the potential TV at the gates is smaller than or at most equal to the potentials on the first bit line halves BL of the internal bit lines and the first external bit line XB, assuming that the separating transistors TT are constructed in accordance with n-channel technology or CMOS-technology). The potential which has been precharged on the first external bit line XB is fundamentally retained. The transfer transistors TT which are connected to the second halves $\overline{BL}$ of the internal bit lines become conductive. Since the second halves $\overline{BL}$ of the internal bit lines are assigned a logical 0 as a result of the preceding read out and amplification procedure regarding the storage cells SZ which are connected to the word line WLi, this is switched through to the other external bit line $\overline{XB}$. As is known, the other external bit line $\overline{XB}$ is already precharged to logical 0. Thus no change occurs in the state of the external bit lines XB,$\overline{XB}$.

The input of the discriminator circuit DISC is connected, for example, through the multiplex circuit MUX, to the external bit line XB or $\overline{XB}$ which was originally precharged to logical 1. In the present example, in which a logical 1 was to be read out from the storage cells SZ of the word line WLi and all of these storage cells SZ which are to be tested are in order (fault-free situation), the logical 1 remains on the first external bit line XB. This is recognized by the discriminator circuit DISC and the output signal thereof, which constitutes the fault signal FS, remains at logical 0, which is to signify "no fault".

If a fault occurs, however, the separating transistor TT of the first bit line half BL of the internal bit lines BL,$\overline{BL}$ which contains the fault becomes conductive. In this case the first bit line half BL which contains the fault is assigned a logical 0. The associated separating transistor TT switches logical 0 to the first external bit line XB. The potential of the external bit line XB is thereby drawn towards "logical 0". This continues until the separating transistors TT of the first bit line halves BL which do not contain faults start to become conductive. An equilibrium occurs at approximately TV-V$_{th}$, where V$_{th}$ is the threshold voltage of the transfer transistors TT. This is recognized by the discriminator circuit which sets the output signal thereof as a fault signal FS at logical 1. The selection of TV as less than the supply potential VCC ensures that in the event of a fault the potential difference of the external bit line XB (or $\overline{XB}$), which was originally precharged to logical 1, is greater than the threshold voltage V$_{th}$ of a separating transistor TT.

In the event that the storage cells SZ which are to be tested are to contain a logical 0, use is made of the fact that in the case of every internal bit line, a signal occurs on the bit line half ($\overline{BL}$ in the present example) which is not connected to the respective storage cell which is to be tested and the signal is complementary to the read-out and amplified read signal, thus a logical 1 in the case of no fault. The first external bit line XB is precharged to logical 0, and the other external bit line $\overline{XB}$ is precharged to logical 1. On the basis of the information given above relating to a test with respect to a logical 1, those skilled in the art will easily be able to deduce that the other external bit line $\overline{XB}$ retains its value of logical 1 in the case of no fault and consequently the discriminator circuit DISC does not activate the fault signal FS, and that in the case of a fault the potential of the other external bit line $\overline{XB}$ is drawn towards logical 0, which is recognized by the discriminator circuit DISC which activates its fault signal accordingly. Therefore this will not be described in detail.

It is advantageous to be able to decouple the discriminator circuit DISC including the multiplex circuit MUX from the external bit lines XB,$\overline{XB}$ or to decouple the discriminator circuit DISC by means of the multiplex circuit MUX, so that during normal operation this circuit portion does not represent an additional load for the external bit lines XB,$\overline{XB}$.

With regard to the generation of special test and control signals, reference is made in particular to U.S. Pat. No. 4,885,748 having the same filing date as the instant application. With regard to special decoder embodiments, reference is made to U.S. Pat. No. 4,906,994 and to U.S. Pat. No. 4,855,621 both having the same filing date as the instant application.

We claim:

1. A circuit configuration for testing storage cells of an
   integrated semiconductor memory which includes a block in which the storage cells are disposed in the form of a matrix, word lines and internal bit lines for driving the storage cells, evaluator circuits each being assigned to a respective internal bit line, each internal bit line having first and second mutually complementary bit line halves, a pair of first and second external bit lines, transfer transistors connecting the first external bit line to each of the first internal bit line halves and connecting the second external bit line to each of the second internal bit line halves, and a bit line decoder assigned to the respective internal bit lines and connected to gates of the transfer transistors;

the circuit configuration comprising a precharge device connected to said pair of external bit lines for precharging the pair of external bit lines to two mutually-complementary logic levels in a test mode, a discriminator circuit having means for sensing potentials, being connected to the pair of external bit lines and having an output for generating a fault signal indicating the occurrence of faults in test operation, the gates of all of the transfer transistors carrying a control potential, said fault signal being generated when the external bit line precharged to the higher level falls in level to at least a value which corresponds to the magnitude of a control potential on the gates of the transfer transistors minus a threshold voltage of the transfer transistors when data is read out from the memory cells during a test mode.

2. A circuit configuration according to claim 1, wherein said control potential is equal to a supply potential of the overall circuit configuration.

3. A circuit configuration according to claim 1, wherein said control potential is equal to at least half the difference between a supply potential and a reference potential of the overall circuit configuration.

4. A circuit configuration according to claim 1, wherein said precharge device includes an RS flip-flop circuit with two mutually-complementary outputs, and precharge transistors respectively connecting said outputs of said RS flip-flop circuit to the pair of external bit lines.

5. A circuit configuration according to claim 1, including means for electrically decoupling said discriminator circuit from the pair of external bit lines.

6. A circuit configuration according to claim 1, wherein said discriminator circuit is a CMOS-inverter circuit having an input, and including means for switching said input of said discriminator circuit between the two external bit lines.

7. A circuit configuration according to claim 6 wherein said CMOS-inverter circuit has a p-channel transistor and an n-channel transistor with equal channel lengths, said p-channel transistor having ten to twenty times the channel width of said n-channel transistor.

8. A method of testing storage cells of a semiconductor memory which includes a block in which the storage cells are disposed in the form of a matrix, word lines and internal bit lines for driving the storage cells, evaluator circuits each being assigned to a respective internal bit line, each of the internal bit lines having first and second mutually complementary bit line halves, first and second external bit lines, pairs of transfer transistors for connecting the first external bit line to each of the first internal bit line halves and connecting the second external bit line to each of the second internal bit line halves; said method of testing comprising the steps of: precharging said two external bit lines to mutually complementary logic levels in a test mode prior to the reading out of data from said storage cells, activating by means of a control signal said pair of transfer transistors, evaluating more than one of the storage cells connected to a word line with a discriminator circuit having means for sensing potentials connected to the two external bit lines, and generating a fault signal at an output of the discriminator circuit, said fault signal being generated when the external bit line precharged to the higher level falls in level to at least a value which corresponds to the magnitude of a control potential on the gates of the transfer transistors minus a threshold voltage of the transfer transistors when data is read out from the memory cells during a test mode.

9. A method according to claim 8, wherein said mutually complementary logic levels are a supply potential and a reference potential of the semiconductor memory.

* * * * *